(12) United States Patent
Beiu

(10) Patent No.: US 6,430,585 B1
(45) Date of Patent: Aug. 6, 2002

(54) NOISE TOLERANT CONDUCTANCE-BASED LOGIC GATE AND METHODS OF OPERATION AND MANUFACTURING THEREOF

(75) Inventor: Valeriu Beiu, Dallas, TX (US)

(73) Assignee: RN2R, L.L.C., Dallas, TX (US)

( * ) Notice: Subject to any disclaimer, the term of this patent is extended or adjusted under 35 U.S.C. 154(b) by 0 days.

(21) Appl. No.: 09/406,367

(22) Filed: Sep. 28, 1999

Related U.S. Application Data

(63) Continuation-in-part of application No. 09/158,947, filed on Sep. 21, 1998, now Pat. No. 6,205,458.

(51) Int. Cl.$^7$ ............................................. G06F 7/50
(52) U.S. Cl. .................... 708/234; 708/675; 708/710; 326/35
(58) Field of Search ................................. 708/234, 675, 708/710; 326/35

(56) References Cited

U.S. PATENT DOCUMENTS

| | | | |
|---|---|---|---|
| 3,609,329 A | * 9/1971 | Martin ................... | 708/675 |
| 3,628,000 A | * 12/1971 | Weiss ...................... | 708/675 |
| 3,715,603 A | 2/1973 | Lerch ...................... | 307/211 |
| 3,818,348 A | * 6/1974 | Puente ..................... | 708/675 |
| 3,866,030 A | 2/1975 | Baugh et al. ............. | 235/164 |
| 3,916,215 A | 10/1975 | Gaskill, Jr. et al. ...... | 307/203 |
| 4,140,920 A | * 2/1979 | Dao et al. ................ | 708/675 |
| 4,858,168 A | 8/1989 | Hwang ..................... | 364/787 |
| 4,982,356 A | * 1/1991 | Ando ....................... | 708/675 |
| 5,016,211 A | 5/1991 | Jeong ...................... | 364/786 |
| 5,034,918 A | 7/1991 | Jeong ...................... | 365/49 |
| 5,053,645 A | 10/1991 | Harada .................... | 307/464 |
| 5,086,405 A | 2/1992 | Chung et al. ............. | 364/748 |
| 5,095,457 A | 3/1992 | Jeong ...................... | 364/758 |
| 5,357,528 A | 10/1994 | Alon et al. ............... | 371/37.9 |
| 5,539,332 A | 7/1996 | Schmookler .............. | 326/53 |
| 5,539,686 A | 7/1996 | Murabayashi et al. ..... | 364/787 |
| 5,608,340 A | 3/1997 | Shibata et al. ............ | 326/36 |
| 5,719,803 A | 2/1998 | Naffziger ................. | 364/787.01 |
| 5,812,521 A | 9/1998 | Levenstein et al. ...... | 364/784.02 |
| 5,847,984 A | 12/1998 | Mahurin ................... | 364/787.01 |
| 5,896,306 A | 4/1999 | Aschwanden ............ | 364/724.011 |
| 5,990,709 A | 11/1999 | Thewes et al. ........... | 327/89 |
| 5,991,789 A | 11/1999 | Prange et al. ............ | 708/625 |
| 6,205,458 B1 | 3/2001 | Beiu ....................... | 708/234 |

OTHER PUBLICATIONS

U.S. Patent application, Ser. No. 09/392,811 entitled "Conductance–Based Logic Gates and Methods of Operation and Manufacturing Thereof" by Valeriu Beiu, filed Sep. 9, 1999, currently pending.

"Engineering Applications of Bio–Inspired Artifical Neural Networks" by Jose Mira and Juan V. Sanchez–Andres: 1999, pp. 116–128.

"A Capacitive Threshold–Logic Gate" by Hakan Ozdemir, Asim Kepkep, Banu Pamir, Ysuf Leblebici and Ugur Cilingiroglu: 1996: pp. 1141–1150.

(List continued on next page.)

Primary Examiner—David H. Malzahn

(57) ABSTRACT

A logic gate, an adder and methods of operating and manufacturing the same. In one embodiment, the logic gate includes: (1) a summer, having at least two single-bit inputs and a noise-suppression input with corresponding conductances representing discrete weights, that generates a weighted sum of input binary digits presented at the at least two single-bit inputs and the noise-suppression input and (2) a quantizer, coupled to the summer, that generates an output binary digit at a binary output thereof that is a function of the weighted sum, the noise-suppression input increasing a noise tolerance of the logic gate.

80 Claims, 5 Drawing Sheets

OTHER PUBLICATIONS

"Explicit Constructions of Depth–2 Majority Circuits for Comparison and Addition" by Noga Alon and Jehoshua Bruck: 1994: pp. 1–8.

"On the Circuit and VLSI Complexity of Threshold Gate Comparison" by Valeriu Beiu: 1998: pp. 1–29.

"On the Circuit Complexity of Sigmoid Feedforward Neural Networks" by Valeriu Beiu and John G. Taylor: 1996: pp. 1155–1171.

"Area–Time Performances of Some Neural Computations" by Valeriu Beiu, Jan A. Peperstraete, Joos Vandewalle, and Rudy Lauwereins; 1994: pp. 664–664–668.

"Neural Logic: Theory and Implementation" by Vasken Bohossian: 1998; pp. 1–99.

"Periodic Symmetric Functions with Feed–Forward Neural Networks" by Sorin Cotofana and Stamatis Vassiliadis: Mar. 1996; pp. 215–221.

"2–1 Redundant Addition with Threshold Logic" by Sorin Cotofana and Stamatis Vassiliadis: Nov. 1996; pp. 889–893.

"Low Weight and Fan–In Neural Networks for Basic Arithmetic Operations" by Sorin Cotofana and Stamatis Vassiliadis; Aug. 1997; pp. 227–232.

"Implementation of Threshold Logic" by Alexander Stokman; Jan. 23, 1998; pp. 1–83.

"2–1 Addition and Related Arithmetic Operations with Threshold Logic" by Stamatis Vassiliadis, Sorin Cotofana and Koen Bertels; Sep. 1996; pp. 1–14.

* cited by examiner-

NOISE TOLERANT CONDUCTANCE-BASED LOGIC GATE AND METHODS OF OPERATION AND MANUFACTURING THEREOF

CROSS-REFERENCE TO RELATED APPLICATIONS

This application is a continuation-in-part of U.S. patent application Ser. No. 09/158,947 ('947 application), entitled "ADDER AND MULTIPLIER CIRCUITS EMPLOYING LOGIC GATES HAVING DISCRETE, WEIGHTED INPUTS AND METHODS OF PERFORMING COMBINATORIAL OPERATIONS THEREWITH," to Valeriu Beiu, filed on Sep. 21, 1998 now U.S. Pat. No. 6,205,458. This application is related to the following U.S. patent applications: Ser. No. 09/392,811 entitled "CONDUCTANCE-BASED LOGIC GATE AND METHODS OF OPERATION AND MANUFACTURING THEREOF" to Valeriu Beiu, filed on Sep. 9, 1999, and Ser. No. 09/407,598 entitled "ADDER HAVING REDUCED NUMBER OF INTERNAL LAYERS AND METHOD OF OPERATION THEREOF" to Valeriu Beiu, filed on 28 Sep. 1999.

The above-listed applications are commonly assigned with the present invention and are incorporated herein by reference as if reproduced herein in their entirety.

TECHNICAL FIELD OF THE INVENTION

The present invention is directed, in general, to logic gates and, more specifically, to a noise tolerant conductance-based logic gate, adder circuits containing the gate and methods of operating and manufacturing the gate.

BACKGROUND OF THE INVENTION

Digital systems are used extensively in computation and data processing, controls, communications and measurement. Digital systems use digital signals that may only assume discrete values. Typically, digital systems use binary signals that employ only two values. Since such systems only use two distinct values, errors caused by component variations are minimized. As a result, a digital system may be designed such that, for a given input, an output thereof is exactly correct and repeatable. This gives rise to the extreme accuracy for which digital systems are well known.

Analog systems, on the other hand, use analog signals that vary continuously over a specified range. Analog systems are thus particularly vulnerable to error, depending on the accuracy of the components used therein. Since digital systems are generally capable of greater accuracy and reliability than analog systems, many tasks formerly performed by analog systems are now performed exclusively by digital systems.

One basic building block of digital systems is a logic gate. Conventional logic gates have one output and one or more inputs. The number of inputs is called the "fan-in" of the gate. The state of the output is completely determined by the state(s) of the input(s). Conventional logic gates are typically created by coupling a number of transistors together to perform a Boolean function (e.g., AND, OR, NOT). The logic gates are then coupled together to form a multi-layer circuit that is capable of performing logical functions (e.g., arithmetic functions).

The maximum number of gates cascaded in series between the input and the output of such a circuit is typically referred to as the number of layers of gates. Designers are concerned with the number of layers in a circuit for several reasons. In some applications, increasing the number of layers may reduce the required number of gates and/or gate inputs (i.e., fan-in), thus reducing the cost (which may be expressed in terms of integrated circuit area) of building the multi-layer circuit. Of course, cascading a larger number of gates together may result in unacceptable input-output delays and data dependency conditions. When the input of a gate is switched, a finite time elapses before the output of the gate changes. If a large number of gates are cascaded together to form a circuit, the time between an input change and a corresponding change in the output of the circuit may become excessive, thereby slowing down the operation of the multi-layer circuit.

Arithmetic functions are particularly susceptible to the effects of cascaded gates. The serial solution for binary addition is given here as an example. Initially, a first augend bit and a first addend bit are combined to produce a first sum bit and a first carry (carry-out) bit. The first carry bit is then combined with the second augend and addend bits to produce the second sum and carry bits. Since the second sum bit is dependent on the value of the first carry bit, the second sum bit cannot be computed before the first carry bit is computed. While each input-output delay is small, the cumulative input-output delay perceived when adding large numbers, due to the propagation of the carry bits, is, in the worst case, proportional to the number of bits added, and may be prohibitive. Techniques (e.g., carry look-ahead, conditional sum) have been developed for reducing the delay to a logarithmic function of the number of input bits to be added. The number of Boolean gates (e.g., AND, OR, NOT) used by such techniques is in the range of 8 n to 35 n, or 2 n log(n) to 3 n log(n), where n is the number of bits to be added and the logarithms are base two.

Increasing processing power is a continuing goal in the development of processors such as microprocessors or digital signal processors (DSPs). Processor designers are generally familiar with three ways to increase the processing power of a central processing unit (CPU). The CPU's clock frequency may be increased so that the CPU can perform a greater number of operations in a given time period. Processors are designed to operate at increasingly high clock frequencies. For instance, the 8080 (introduced in 1974 by the Intel Corporation) was designed to operate at about 2 to 3 MHz. Today, Intel's Pentium line of processors are designed to operate with clock frequencies over 400 MHz. While a higher clock frequency generally results in increased processing power, the higher clock frequency also increases power dissipation, resulting in higher device operating temperatures. Processor designers, therefore, must address these additional problems to avoid catastrophic device failures.

Another way to increase processing power is to increase input and output data bus width, thereby allowing the CPU to process a greater amount of code and data. Early processors were packaged using dual in-line packaging (DIP) technology. Increasing the width of the data buses was both expensive and unrealistic, often resulting in extremely large device packages. Today, with the use of pin grid array (PGA) packaging, increasing the size of the data buses no longer poses a packaging problem. Of course, a larger number of transistors is required to process the additional information conveyed by the wider data buses.

Yet another way to increase processing power is to change the internal architecture of the processor to overlap the execution of instructions by, for example, superscaling. This method also requires the addition of a large number of transistors, since entire processing stages or execution units must be duplicated. Performing a large number of instructions in parallel may also result in data dependency problems.

Accordingly, what is needed in the art is a new noise tolerant logic gate that performs logical operations (including mathematical operations, such as addition) significantly faster than prior art logic gates.

SUMMARY OF THE INVENTION

To address the above-discussed deficiencies of the prior art, the present invention provides a logic gate, an adder and methods of operating and manufacturing the same. In one embodiment, the logic gate includes: (1) a summer, having at least two single-bit inputs and a one noise-suppression input with corresponding conductances representing discrete weights, that generates a weighted sum of input binary digits presented at the at least two single-bit inputs and the noise-suppression input and (2) a quantizer, coupled to the summer, that generates an output binary digit at a binary output thereof that is a function of the weighted sum, the noise-suppression input increasing a noise tolerance of the logic gate.

In another embodiment, the logic gate includes: (1) a summer, having at least two single-bit inputs and an anti-floating input with corresponding conductances representing discrete weights, that generates a weighted sum of input binary digits presented at the at least two single-bit inputs and the anti-floating input and (2) a quantizer, coupled to the summer, that generates an output binary digit at a binary output thereof that is a function of the weighted sum, the anti-floating input preventing the weighted sum from being in an indefinite state.

The present invention therefore introduces the broad concept of employing the principles of conductance and more than two gate-internal, discrete logic levels to perform logical operations (including mathematical operations, such as addition) significantly faster than prior art logic gates. The present invention further introduces the concept of employing a noise-suppression input to increase the noise tolerance of the logic gate. The present invention still further introduces the concept of employing an anti-floating input to prevent the output of the logic gate from being in an indefinite state.

In one embodiment of the present invention, the summer includes a noise-suppression logic circuit that develops the noise-suppression input. The noise-suppression logic circuit may implement a Boolean sub-function of the function performed by the gate.

In one embodiment of the present invention, the summer includes an anti-floating logic circuit that develops the anti-floating input. The anti-floating logic circuit may implement a Boolean sub-function of the function performed by the gate. In a preferred embodiment, the Boolean sub-function may be an AND logic function.

In one embodiment of the present invention, some of the input binary digits presented at the at least two single-bit inputs are also presented at the noise-suppression logic circuit. In an alternative embodiment, all of the input binary digits presented at the at least two single-bit inputs are also presented at the noise-suppression logic circuit.

In one embodiment of the present invention, some of the input binary digits presented at the at least two single-bit inputs are also presented at the anti-floating logic circuit. In an alternative embodiment, all of the input binary digits presented at the at least two single-bit inputs are also presented at the anti-floating logic circuit.

In one embodiment of the present invention, the discrete weights are integer multiples of a predetermined number. The predetermined number may be "1," allowing the discrete weights to assume integer values. Of course, the predetermined number may be any suitable real number.

In one embodiment of the present invention, each of the at least two single-bit inputs, the noise-suppression input and the anti-floating input includes: (1) a voltage source and (2) a transistor, coupled to the voltage source and having a selectable intrinsic conductance, that couples the voltage source to the summer as a function of a corresponding particular input binary digit. In a preferred embodiment, the voltage source may be obtained from a reference voltage source having, at least temporarily, a substantially constant voltage level. In one embodiment, the voltage source may be a timing signal (such as a clock signal).

In a related embodiment, the transistor has a size that determines the selectable intrinsic conductance. The transistor may be selected from the group consisting of: (1) a p-channel metal oxide semiconductor (MOS) transistor and (2) an n-channel MOS transistor. Alternatively, the transistor may be of any other conventional or later-discovered type.

In an embodiment to be illustrated and described, a greater one of the discrete weights is associated with a one of the at least two binary inputs having a p-channel MOS transistor. The remaining discrete weights are associated with n-channel MOS transistors. Of course, this need not be the case.

In one embodiment of the present invention, the gate further includes a threshold input that provides a threshold number to the quantizer, the output binary digit being a function of a relationship between the weighted sum and the threshold number. In an embodiment to be illustrated and described, the quantizer produces a high logic level if the weighted sum exceeds the threshold number and a low logic level otherwise.

In a related embodiment, the threshold number is determined by relative sizes of at least two transistors forming the quantizer. Of course, the threshold number may simply be input into the quantizer.

In one embodiment of the present invention, the quantizer includes an inverter. It has been found that an inverter provides a particularly fast quantization of the weighted sum. Of course, other quantizers (e.g., comparators, differential amplifiers, sense amplifiers and integrators), are well within the broad scope of the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
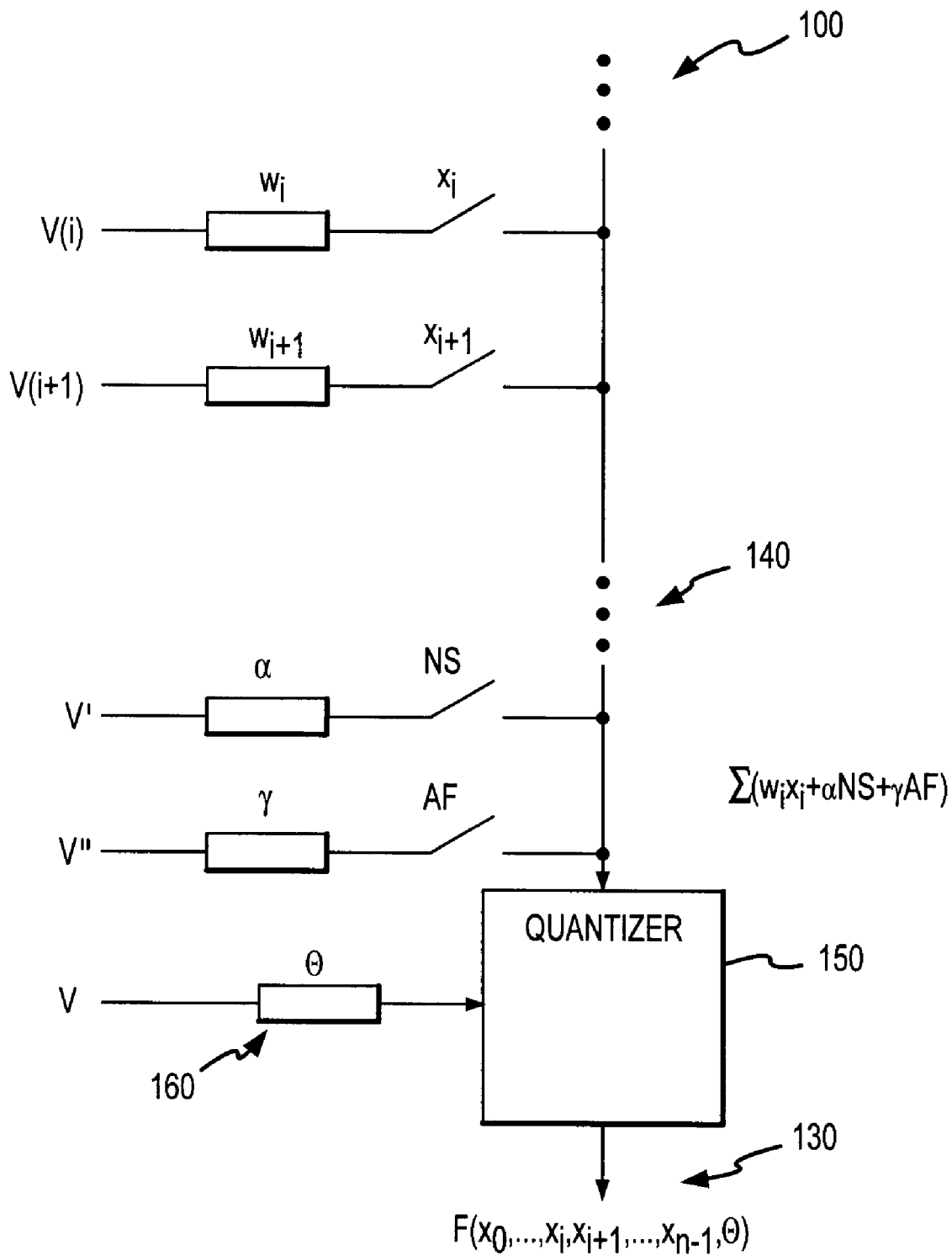
FIG. 1 illustrates a schematic diagram of an embodiment of a logic gate constructed in accordance with the principles of the present invention.

Referring initially to FIG. 1, illustrated is a schematic diagram of an embodiment of a logic gate 100 constructed in accordance with the principles of the present invention. The logic gate 100 includes a summer 140 having first and second binary (single-bit) inputs $x_i$, $x_{i+1}$ with corresponding conductances representing first and second discrete weights $w_i$, $w_{i+1}$. The summer 140 further includes a noise-suppression input NS and an anti-floating logic input AF with corresponding conductances representing third and fourth discrete weights $\alpha$, $\gamma$. The summer 140 generates a weighted sum of first and second input binary digits presented at the first and second binary inputs $x_i$, $x_{i+1}$, the noise-suppression input NS and the anti-floating logic input AF. The logic gate 100 further includes a quantizer 150 coupled to the summer 140. The quantizer 150 generates an output binary digit at a binary output 130 thereof that is a function of the weighted sum. In the illustrated embodiment, the logic gate 100 still further includes a threshold input 160 that provides a threshold number $\Theta$ to the quantizer 150, which is subtracted from the weighted sum. The output binary digit is, therefore, a function of a relationship between the weighted sum and the threshold number 8. In the illustrated embodiment, the logic gate 100 may perform the following function:

$$F(x_0, \ldots, x_i, \ldots, x_{i+1}, \ldots, x_{n-1}, \Theta) = sgn(\Sigma w_i x_i + \alpha NS + \gamma AF - \Theta).$$

Figure 2:
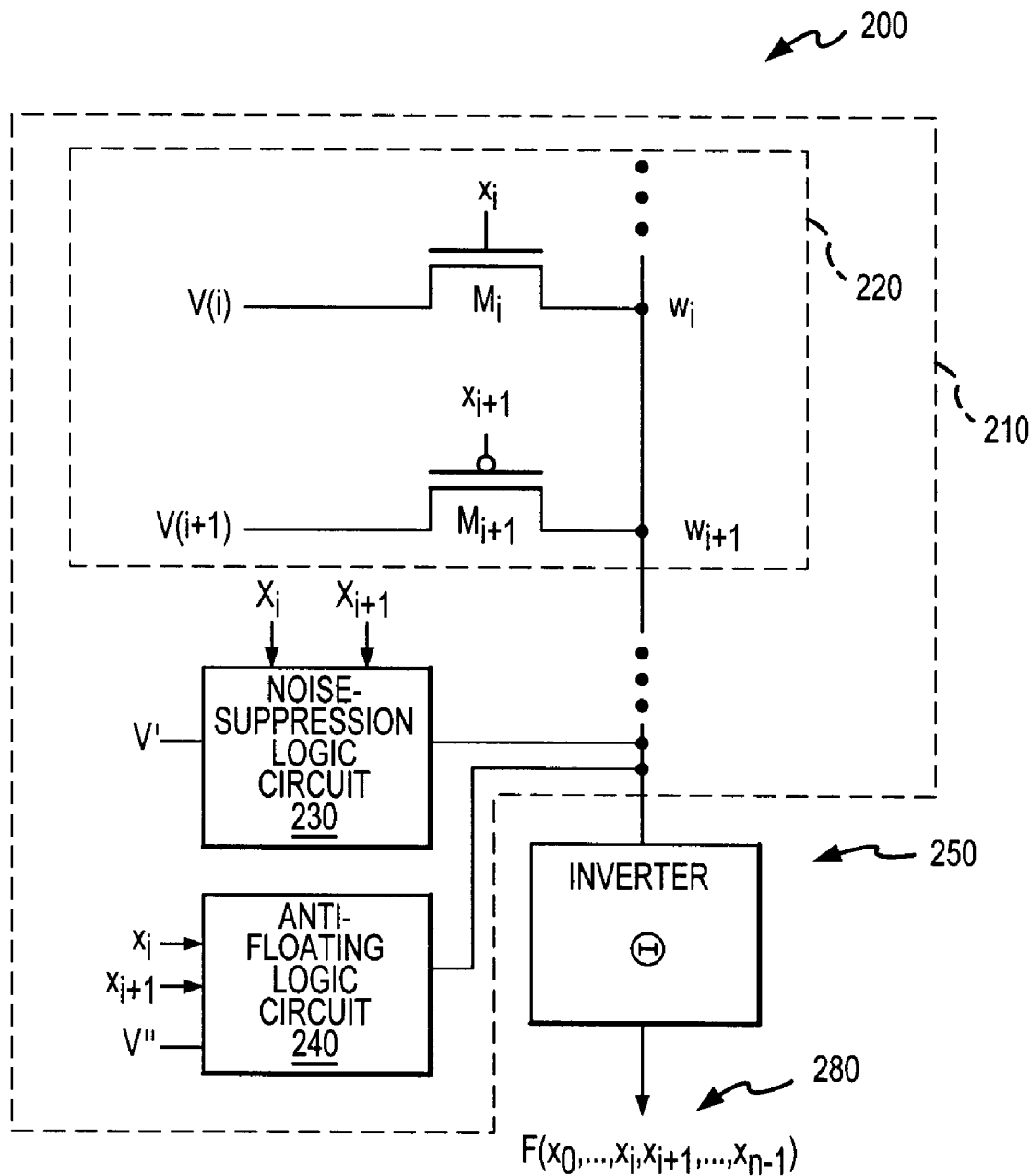
FIG. 2 illustrates a schematic diagram of an embodiment of a noise tolerant conductance-based logic gate constructed in accordance with the principles of the present invention.

Turning now to FIG. 2, illustrated is a schematic diagram of an embodiment of a noise tolerant conductance-based logic gate 200 constructed in accordance with the principles of the present invention. The logic gate 200 is designed to implement a function F(X). The logic gate 200 includes a summer 210 having a first circuit 220 that implements a linearly separable form of the function F(X), a second circuit (noise-suppression logic circuit) 230 that implements a noise-suppression Boolean sub-function of the function F(X), and a third circuit (anti-floating logic circuit) 240 that implements an anti-floating Boolean sub-function of the function F(X).

In the illustrated embodiment, the first circuit 220 includes first and second binary inputs $x_i$, $x_{i+1}$ with corresponding first and second discrete weights $w_i$, $w_{i+1}$. The first and second binary inputs $x_i$, $x_{i+1}$ include first and second voltage sources V(i), V(i+1) coupled to first and second transistors $M_i$, $M_{i+1}$, respectively. Each of the first and second transistors $M_i$, $M_{i+1}$ has a selectable conductance determined by its size. The first and second discrete weights $w_i$, $w_{i+1}$ may thus be determined as a function of the first and second voltage sources V(i), V(i+1) and the conductances of the first and second transistors $M_i$, $M_{i+1}$. The first and second discrete weights $w_i$, $w_{i+1}$ may be varied by either varying a voltage of the first and second voltage sources V(i), V(i+1), the conductances of the first and second transistors $M_i$, $M_{i+1}$, or any combination thereof.

The first and second transistors $M_i$, $M_{i+1}$ are illustrated as n-channel metal oxide semiconductor (MOS) and p-channel MOS transistors, respectively. Those skilled in the pertinent art will appreciate that the n-channel and p-channel MOS transistors may be employed as necessary, depending on the logic function F(x) to be implemented.

In the illustrated embodiment, the noise-suppression logic circuit 230 implements the noise-suppression Boolean sub-function of the function F(X) to develop a noise-suppression input. The noise-suppression logic circuit 230 is coupled to a third voltage source V' and is adapted to receive the first and second binary inputs $x_i$, $x_{i+1}$. The combination of the linearly separable form of the function F(X) and the noise-suppression Boolean sub-function makes a transfer function of the logic gate 200 non-linear and separates certain pertinent voltage levels, while compressing certain extraneous voltage levels. Separating the pertinent voltage levels may thus increase a noise tolerance of the logic gate 200.

In the illustrated embodiment, the anti-floating logic circuit 240 implements the anti-floating Boolean sub-function of the function F(X) to develop an anti-floating input. The anti-floating logic circuit 240 is coupled to a fourth voltage source V'' and is adapted to receive the first and second binary inputs $x_i$, $x_{i+1}$. The anti-floating logic circuit 240 determines the value of the summer 210 when all the transistors forming the first circuit 220 are off, thus preventing the summer from floating.

In the illustrated embodiment, the summer 210 generates a weighted sum of the first and second binary inputs $x_i$, $x_{i+1}$ presented at the first circuit 220, the noise-suppression logic circuit 230 and the anti-floating logic circuit 240.

The logic gate 200 further includes a quantizer 250, coupled to the first, second and third circuits 220, 230, 240 that generates an output binary digit at a binary output 280 thereof that is a function of a relationship between the weighted sum and a threshold number $\Theta$. In the illustrated embodiment, the quantizer 250 is an inverter. The threshold number $\Theta$ may be varied by changing the relative sizes of the transistors forming the inverter.

Figure 3A:
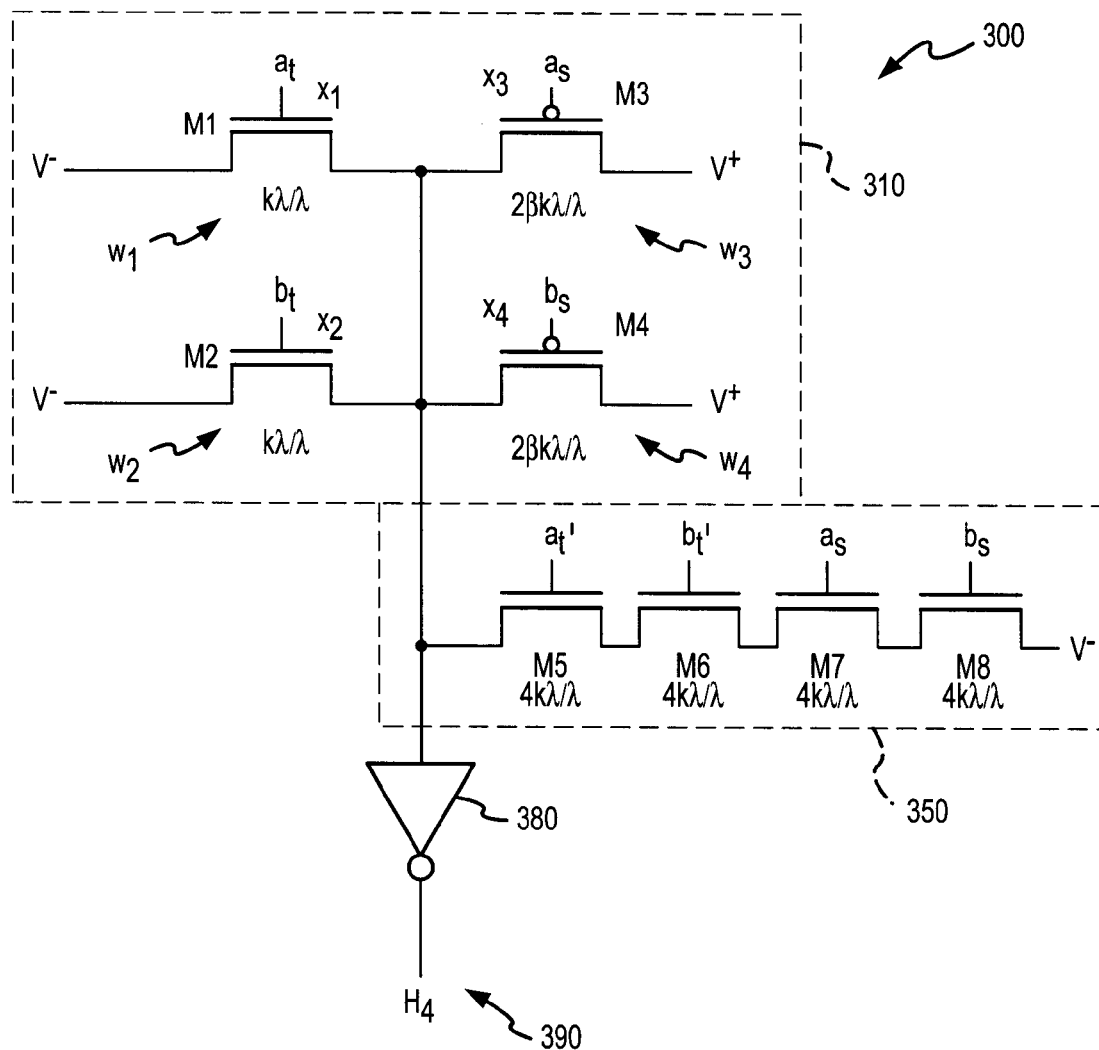
FIG. 3A illustrates a schematic diagram of an embodiment of a conductance-based logic gate employing an anti-floating logic circuit constructed in accordance with the principles of the present invention.

Turning now to FIG. 3A, illustrated is a schematic diagram of an embodiment of a conductance-based logic gate 300 employing an anti-floating logic circuit 350 constructed in accordance with the principles of the present invention. The logic gate 300 includes a summer 310 having first, second, third and fourth binary inputs $x_1$, $x_2$, $x_3$, $x_4$, with corresponding first, second, third and fourth conductances $w_1$, $w_2$, $w_3$, $w_4$ representing first, second, third and fourth discrete weights 1, 1, 2, 2. The first, second, third and fourth binary inputs $x_1$, $x_2$, $x_3$, $x_4$, are adapted to receive first, second, third and fourth input binary digits $a_t$, $b_t$, $a_s$, $b_s$, respectively, such that the logic gate 300 may implement the function $$H_4 = (a_s \wedge b_s) \vee [(a_s \vee b_s) \wedge a_t \wedge b_t] = sgn(2 \cdot a_s + 2 \cdot b_s + 1 \cdot a_t + 1 \cdot b_t - 3.5)$$

wherein "V" represents a logical OR function and "∧" represents a logical AND function. The summer 310 generates a weighted sum of the first, second, third and fourth input binary digits $a_t$, $b_t$, $a_s$, $b_s$, at the first, second, third and fourth binary inputs $x_1$, $x_2$, $x_3$, x4, respectively.

The logic gate 300 further includes a quantizer 380 (illustrated as an inverter). The quantizer 380 is coupled to the summer 310 and generates an output binary digit at a binary output 390 of the logic gate 300 that is a function of the weighted sum.

In the illustrated embodiment, the summer 310 includes first, second, third and fourth metal oxide semiconductor (MOS) transistors M1, M2, M3, M4 associated with the first, second, third and fourth input binary digits $a_t$, $b_t$, $a_s$, $b_s$, respectively. Since MOS transistors have an intrinsic on-state conductance, the first, second, third and fourth conductances $w_1$, $w_2$, $w_3$, $w_4$, representing the first, second, third and fourth discrete weights 1, 1, 2, 2 may be realized by the first, second, third and fourth MOS transistors M1, M2, M3, M4, respectively. The intrinsic on-state conductance of a MOS transistor may be determined by the dimensions of the channel of the MOS transistor and by the mobility of holes/electrons through the channel. The dimensions of the channels of the first, second, third and fourth MOS transistors M1, M2, M3, M4 will therefore be discussed subject to the following assumptions: (1) that $\lambda$ represents a minimum feature size of the complementary metal oxide semiconductor (CMOS) process, (2) that k represents a proportionality factor corresponding to the discrete weights and (3) that $\beta$ represents a mobility of holes versus electrons (which is assumed to be constant).

In the illustrated embodiment, the first and second MOS transistors M1, M2 are an n-channel MOS transistors having dimensions of k$\lambda$ by $\lambda$ and coupled between an input of the quantizer 180 and a negative voltage source $V^-$ (e.g., GND). The third and fourth MOS transistors M3, M4 are p-channel MOS transistors having dimensions of 2$\beta$k$\lambda$ by $\lambda$ and coupled between an input of the quantizer 280 and a positive voltage source $V^+$ (e.g., VDD). The dimensions of the first and second MOS transistors M1, M2 are scaled with respect to the dimensions of the third and fourth MOS transistors M3, M4 based on the mobility factor $\beta$ and a relationship between the respective discrete weights. Of course, the proportionality factor k, as well as the sizing of the transistors forming the quantizer 380 may be used as design parameters to modify the speed, driving capability, surface area and power consumption of the logic gate 300. Additionally, the logic gate 300 may be optimized by introducing small variations in the size of the first, second, third and fourth MOS transistors M1, M2, M3, M4.

The logic gate operates as follows. If both the third and fourth input binary digits $a_s$, $b_s$ are high (i.e., $a_s$ $b_s$=11), both the third and fourth MOS transistors M3, M4 will be off and the input of the quantizer 380 will be low (i.e., 0) if at least one of the first and second input binary digits $a_t$, $b_t$ is high. The output of the quantizer 380 will, therefore, be high (i.e., 1).

If both the third and fourth input binary digits $a_s$, $b_s$ are low (i.e., $a_s$ $b_s$=00), both the third and fourth MOS transistors M3, M4 will be on and the input of the quantizer 380 will be high (i.e., 1) regardless of the values of the first and second input binary digits $a_t$, $b_t$. The output of the quantizer 380 will, therefore, be low (i.e., 0).

If either of the third or fourth input binary digits $a_s$, $b_s$ is low (i.e., $a_s$ $b_s$=01 or $a_2$ $b_s$=10), one of the third or fourth MOS transistors M3, M4 will be on while the other will be off. Due to the sizing of the MOS transistors, only when both the first and second input binary digits $a_t$, $b_t$ are high (i.e., $a_t$ $b_t$=11) will the voltage drop on the one of the third or fourth MOS transistors M3, M4 that is on be sufficient to produce a low (i.e., 0) at the input of the quantizer 380 and, therefore, a high (i.e., 1) at the output of the quantizer 380. If, however, only one of the first and second input binary digits $a_t$, $b_t$ are high (i.e., $a_t$ $b_t$=01 or $a_t$ $b_t$=10), the voltage drop on the one of the third or fourth MOS transistors M3, M4 that is on will be insufficient to produce a low (i.e., 0) at the input of the quantizer 380. The input of the quantizer 380 will be high (i.e., 1), resulting in a low (i.e., 0) at the output of the quantizer 380. Of course, if both the first and second input binary digits $a_t$, $b_t$ are low (i.e., $a_t$ $b_t$=00), both the first and second MOS transistors M1, M2 will be off. The input of the quantizer 380 will be high (i.e., 1), resulting in a low (i.e., 0) at the output of the quantizer 380.

If both the third and fourth input binary digits $a_s$, $b_s$ are high (i.e., $a_s$ $b_s$=11), both the third and fourth MOS transistors M3, M4 will be off. Then, if both the first and second input binary digits $a_t$, $b_t$ are low (i.e., $a_t$ $b_t$=00), both the first and second MOS transistors M1, M2 will be off. The input of the quantizer 380 will be floating, resulting in an indefinite state at the output of the quantizer 380. The logic gate 300, therefore, includes the anti-floating logic circuit 350, which implements the AND function $a_s \wedge b_s \wedge a_t' \wedge b_t'$. In the illustrated embodiment, the anti-floating logic includes fifth, sixth, seventh and eighth MOS transistors M5, M6, M7, M8 series coupled to the negative reference voltage source $V_{ref}^-$ (e.g., GND). The fifth, sixth, seventh and eighth MOS transistors M5, M6, M7, M8 are preferably sized such that a speed of the logic gate 300 is not substantially degraded.

The anti-floating logic circuit 350 is active only when both the third and fourth input binary digits $a_s$, $b_s$ are high (i.e., $a_s$ $b_s$=11) and both the first and second input binary digits $a_t$, $b_t$ are low (i.e., $a_t$ $b_t$=00) to prevent the input of the quantizer 380 from being indefinite.

Figure 3B:
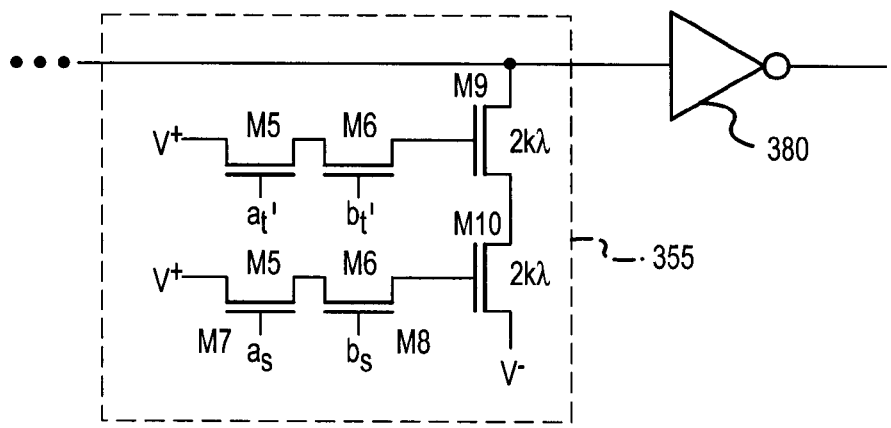
FIG. 3B illustrates another embodiment of an anti-floating logic circuit 355 constructed in accordance with the principles of the present invention.

Turning now to FIG. 3B, illustrated is another embodiment of an anti-floating logic circuit 355 constructed in accordance with the principles of the present invention. The anti-floating logic circuit 355 is analogous to the anti-floating logic circuit 350 illustrated and described with respect to FIG. 3A. Those skilled in the pertinent art will realize that other embodiments of the anti-floating logic circuit 355 (or the anti-floating logic circuit 350 of FIG. 3A) are possible and are well within the broad scope of the present invention.

Figure 4:
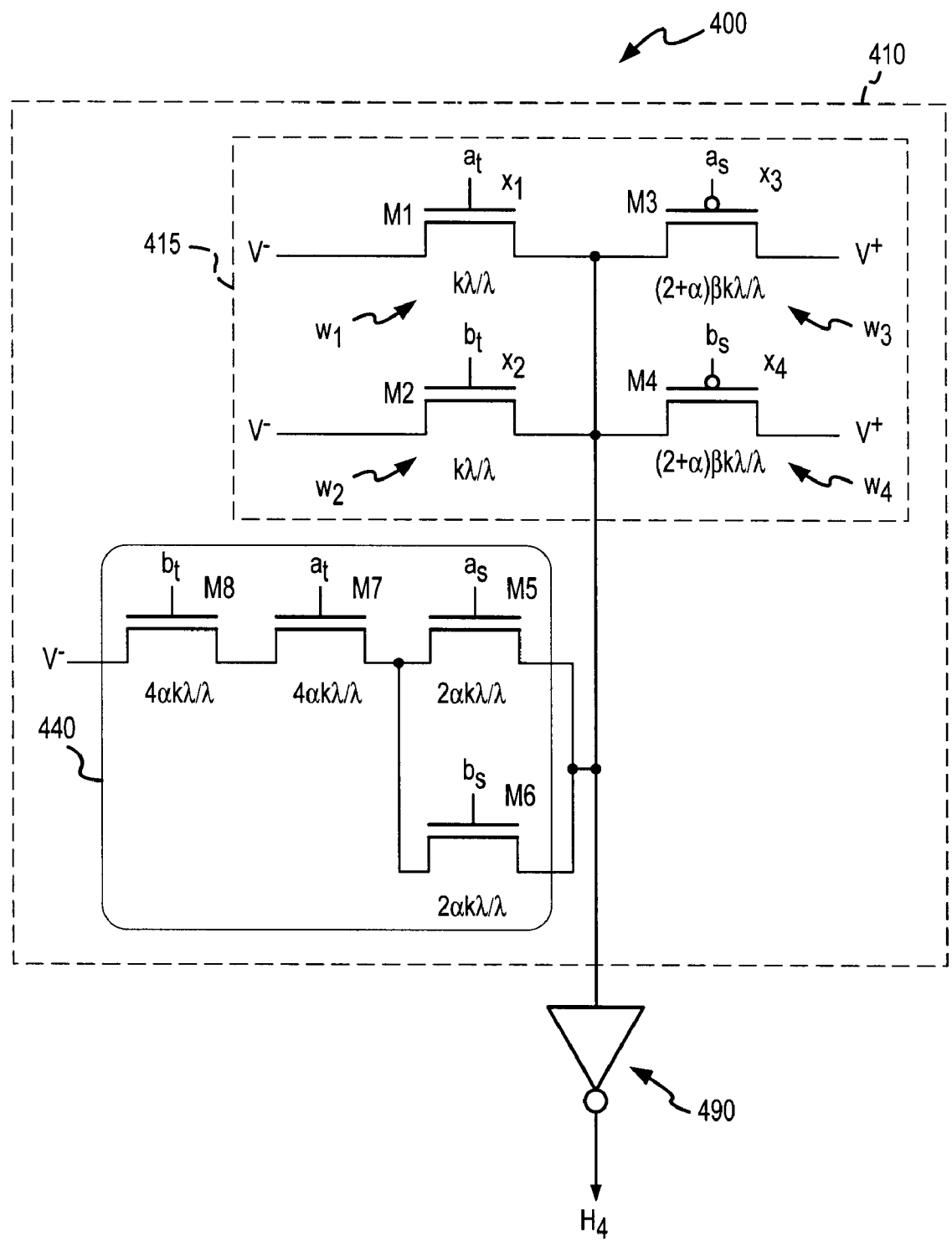
FIG. 4 illustrates a schematic diagram an embodiment of a noise tolerant conductance-based logic gate constructed in accordance with the principles of the present invention.

Turning now to FIG. 4, illustrated is a schematic diagram an embodiment of a noise tolerant conductance-based logic gate 400 constructed in accordance with the principles of the present invention. The logic gate 400 is designed to implement the function $$H_4 = a_s \wedge b_s \vee (a_s \vee b_s) \wedge a_t \wedge b_t$$
$$= \mathrm{sgn}\{(2+\alpha) \cdot a_s + (2+\alpha) \cdot b_s + 1 \cdot a_t + 1 \cdot b_t +$$
$$\alpha \cdot [(a_s \vee b_s) \wedge a_t \wedge b_t] - (7+3\alpha)/2\}$$

wherein "$\vee$" represents a logical OR function and "$\wedge$" represents a logical AND function. The logic gate 400 includes a summer 410 having a first circuit 415 that implements a linearly separable form of the function $$H_4 = sgn[(2+\alpha) \cdot a_s + (2+\alpha) \cdot b_s + 1 \cdot a_t + 1 \cdot b_t - (7+2\alpha)/2].$$

and a second circuit (noise-suppression logic circuit) 440 that implements a Boolean sub-function of the function $H_4$. In the illustrated embodiment, the Boolean sub-function implemented by the second circuit 440 may be represented as:

$$H_4^* = (a_s \vee b_s) \wedge a_t \wedge b_t$$

wherein "$\vee$" represents a logical OR function and "$\wedge$" represents a logical AND function. The combination of the linearly separable form of the function $H_4$ and the Boolean sub-function $H_4^*$ makes the transfer function of the logic gate 400 non-linear and better separates certain pertinent voltage levels, while compressing certain extraneous voltage levels. Separating the pertinent voltage levels may thus increase the noise tolerance of the logic gate 400.

In the illustrated embodiment, the first circuit 415 includes first, second, third and fourth binary inputs $x_1$, $x_2$, $x_3$, $x_4$, with corresponding first, second, third and fourth conductances $w_1$, $w_2$, $w_3$, $w_4$ representing first, second, third and fourth discrete weights 1, 1, 2+α, 2+α. The first, second, third and fourth binary inputs (single-bit inputs) $x_1$, $x_2$, $x_3$, $x_4$, are adapted to receive first, second, third and fourth input binary digits $a_t$, $b_t$, $a_s$, $b_s$, respectively. The noise-suppression logic circuit 440 is adapted to receive the first, second, third and fourth input binary digits $a_t$, $b_t$, $a_s$, $b_s$.

The summer 410 generates a weighted sum of the first, second, third and fourth input binary digits $a_t$, $b_t$, $a_s$, $b_s$ presented to the first, second, third and fourth binary inputs $x_1$, $x_2$, $x_3$, $x_4$, of the first circuit 410 and the noise-suppression input of the noise-suppression logic circuit 440.

The logic gate 400 further includes a quantizer 490 (illustrated as an inverter). The quantizer 490 is coupled to the summer 410 and generates an output binary digit at a binary output of the logic gate 400 that is a function of the weighted sum.

In the illustrated embodiment, the first circuit 415 includes first, second, third and fourth metal oxide semiconductor (MOS) transistors M1, M2, M3, M4 associated with the first, second, third and fourth input binary digits $a_t$, $b_t$, $a_s$, $b_s$, respectively. The first circuit 415 is analogous to the summer 310 illustrated and described with respect to FIG. 3A.

The noise-suppression logic circuit 440 includes an OR sub-circuit, having parallel-coupled fifth and sixth MOS transistors M5, M6, that implements the function $$a_s \vee b_s$$

wherein "∨" represents a logical OR function.

The noise-suppression logic circuit 440 further includes an AND sub-circuit, having series-coupled seventh and eighth MOS transistors M7, M8, that implements the function $$a_t \wedge b_t$$

wherein "∧" represents a logical AND function.

The OR and AND sub-circuits are coupled in series, implementing the Boolean sub-function $$H_4^* = (a_s \vee b_s) \wedge a_t \wedge b_t$$

of the function $H_4$, wherein "∨" represents the logical OR function and "∧" represents the logical AND function. Of course, other implementations of the Boolean sub-function $H_4^*$ are possible and are well within the broad scope of the present invention.

The intrinsic on-state conductance of a MOS transistor may be determined by the dimensions of the channel of the MOS transistor and by a mobility of holes/electrons through the channel. The dimensions of the channels of the MOS transistors M1, M2, M3, M4, M5, M6, M7, M8 will therefore be discussed subject to the following assumptions: (1) that λ represents a minimum feature size of the complementary metal oxide semiconductor (CMOS) process, (2) that k represents a proportionality factor corresponding to the discrete weights, (3) that β represents a mobility of holes/electrons (which is assumed to be constant) and (4) that α represents a scaling factor for sizing the transistors forming the noise-suppression logic circuit 440, (e.g., for α=0, the second circuit 440 is not employed and the logic gate 400 may be substantially similar to the logic gate 300 of FIG. 3A; for α>0, the second circuit 440 is employed and implements the Boolean sub-function, $H_4^* = (a_s \vee b_s) \wedge a_t \wedge b_t$ of the function $H_4$).

In the illustrated embodiment, the fifth and sixth MOS transistors M5, M6 of the OR sub-circuit are parallel-coupled n-channel MOS transistors having dimensions of 2αkλ by λ and are adapted to receive the third and fourth input binary digits $a_s$, $b_s$, respectively. The seventh and eighth MOS transistors M7, M8, of the AND sub-circuit are series-coupled n-channel MOS transistors having dimensions of 4αkλ by λ and are adapted to receive the first and second input binary digits $a_t$, $b_t$, respectively. Since the OR and AND sub-circuits are series-coupled, the noise-suppression logic circuit 440, when active, is equivalent to one transistor having, at most, dimensions of αkλ by λ. Of course, other dimensions are well within the broad scope of the present invention (e.g., the fifth, sixth, seventh and eighth MOS transistors M5, M6, M7, M8, may all have dimensions of 3·αkλ by λ). Also, a progressive sizing of the fifth, sixth, seventh and eight MOS transistors M5, M6, M7, M8 may be employed wherein the dimensions of the transistor are increased based on its proximity to the negative voltage source V⁻ (e.g., GND). Further, the noise-suppression logic circuit 440 may be optimized by introducing small variations in the size of the fifth, sixth, seventh and eight MOS transistors M5, M6, M7, M8. Those skilled in the pertinent art will realize that other implementations of the Boolean sub-function $H_4^*$ are possible and are well within the broad scope of the present invention.

The dimensions of the first, second, third and fourth metal oxide semiconductor (MOS) transistors M1, M2, M3, M4 may be modified from the dimensions illustrated with respect to the logic gate 300 of FIG. 3A to accommodate the noise-suppression logic circuit 440. In the illustrated embodiment, the first and second MOS transistors M1, M2 are n-channel MOS transistors having dimensions of kλ by λ and coupled between an input of the quantizer 490 and the negative voltage source V⁻ (e.g., GND). The third and fourth MOS transistors M3, M4 are p-channel MOS transistors having dimensions of (2+α)βkλ by λ and coupled between an input of the quantizer 490 and a positive voltage source V⁺ (e.g., VDD).

The logic gate 400 operates analogously to the logic gate 300 of FIG. 3A except when the noise-suppression logic circuit 440 is active (i.e., when either the third input binary digit $a_s$ or the fourth input binary digit $b_s$ is high and both the first and second input binary digits $a_t$, $b_t$ are high). If both the third and fourth input binary digits $a_s$ and $b_s$ are high (i.e., $a_s b_s=11$), both the third and fourth MOS transistors M3, M4 will be off and the input of the quantizer 490 will be low (i.e., 0) if at least one of the first and second input binary digits $a_t$, $b_t$ is high (either the first or second MOS transistors M1, M2 being on). The output of the quantizer 490 will, therefore, be high (i.e., 1). If both the third and fourth input binary digits $a_s$, $b_s$ are low (i.e., $a_s b_s=00$), both the third and fourth MOS transistors M3, M4 will be on and the input of the quantizer 490 will be high (i.e., 1) regardless of the values of the first and second input binary digits $a_t$, $b_t$. The output of the quantizer 490 will, therefore, be low (i.e., 0).

If either the third or fourth input binary digits $a_s$, $b_s$ is low (i.e., $a_s b_s=01$ or $a_s b_s=10$), one of the third or fourth MOS transistors M3, M4 will be on while the other will be off. Due to the sizing of the MOS transistors, only when both the first and second input binary digits $a_t$, $b_t$ are high (i.e., $a_t b_t=11$) will the voltage drop on the one of the third or fourth MOS transistors M3, M4 that is on be sufficient to produce a low (i.e., 0) at the input of the quantizer 490 and, therefore, a high (i.e., 1) at the output of the quantizer 490. In this case, the voltage drop may be increased by the second circuit 440, which is now active. If, however, either the first or second input binary digits $a_t$, $b_t$ is high (i.e., $a_t$ $b_t$=10), the second circuit 440 is not active and the voltage drop on the one of the third or fourth MOS transistors M3, M4 that is on will be lower, producing a high (i.e., 1) at the input of the quantizer 490 and, therefore, a low (i.e., 0) at the output of the quantizer 490. Of course, if both the first and second input binary digits $a_t$, $b_t$ are low (i.e., $a_t$ $b_t$=00), both the first and second MOS transistors M1, M2 will be off. In this case, the noise-suppression logic circuit 440 will be inactive because the seventh and eighth MOS transistors M7, M8 are both off. The input of the quantizer 490 will be high (i.e., 1), resulting in a low (i.e., 0) at the output of the quantizer 490.

By modifying the scaling factor $\alpha$, the voltage drops may be selectively increased or decreased. The noise-suppression logic circuit 440 may thus increase the noise tolerance of the logic gate 400. Of course, an anti-floating logic circuit (such as the anti-floating logic circuit 350 of FIG. 3A) may be employed as desired.

Figure 5:
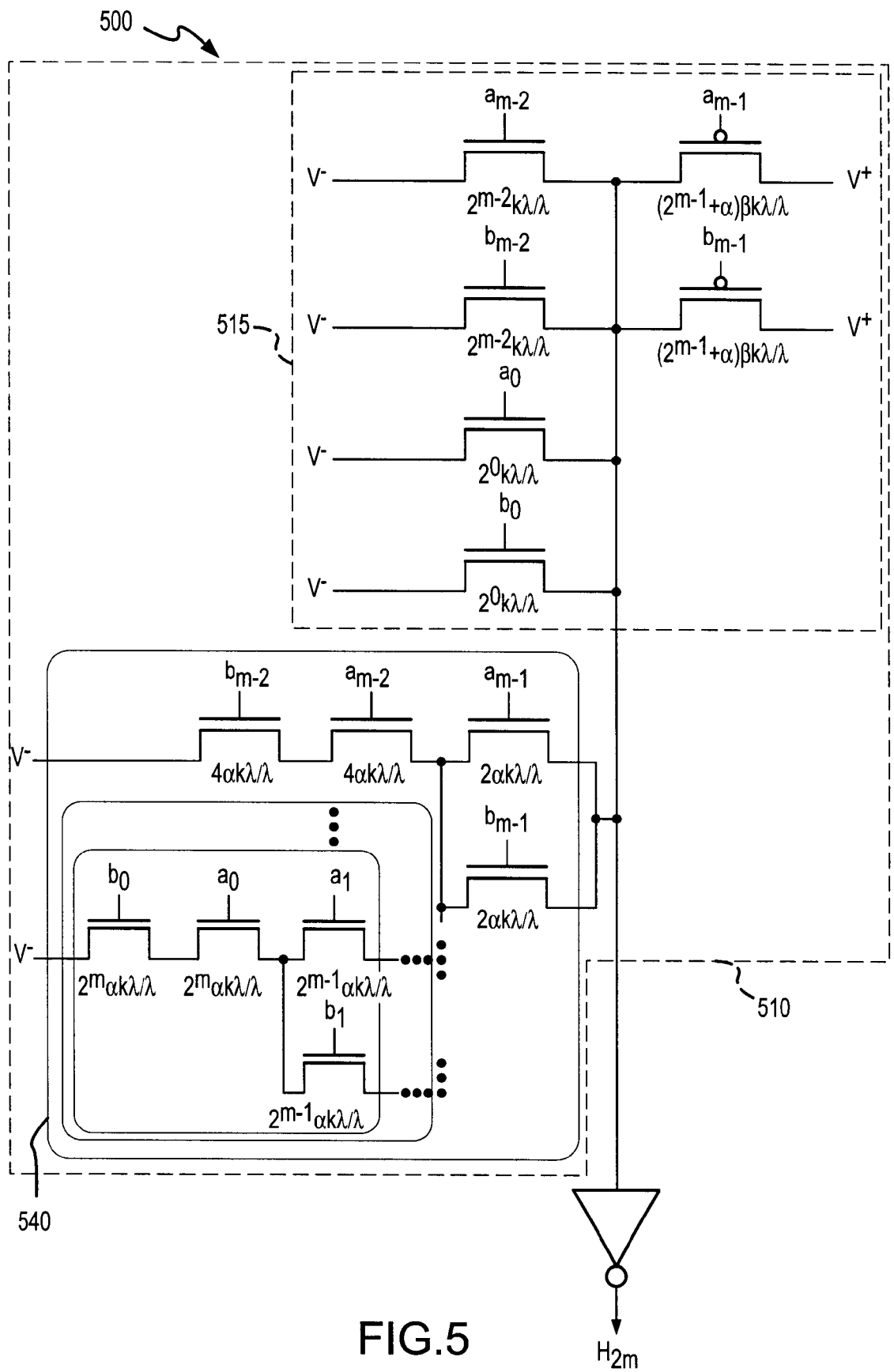
FIG. 5 illustrates a generalized schematic diagram of another embodiment of a noise tolerant conductance-based logic gate constructed in accordance with the principles of the present invention.

Turning now to FIG. 5, illustrated is a generalized schematic diagram of another embodiment of a noise tolerant conductance-based logic gate 500 constructed in accordance with the principles of the present invention. The logic gate 500 is designed to implement the function $$H_{2m}=(a_{m-1} \wedge b_{m-1}) \vee [(a_{m-1} \vee b_{m-1}) \wedge a_{m-2} \vee b_{m-2}] \wedge \ldots \wedge [(a_{m-1} \vee b_{m-1}) \wedge \ldots \wedge (a_1+b_1) \wedge a_0 \wedge b_0$$

wherein "$\vee$" represents the logical OR function and "$\wedge$" represents the logical AND function.

The logic gate 500 includes a summer 510 having a first circuit 515 that implements a linearly separable form of the function $$H_{2m}=sgn[2^{m-1}a_{m-1}+2^{m-1}b_{m-1}+2_{m-2}a_{m-2}+2^{m-2}b_{m-2}+\ldots+2^0a_0+2^0b_0-(2^m-0.5)].$$

The summer 510 further has a noise-suppression logic circuit 540 that implements a Boolean sub-function of the function $H_{2m}$. In the illustrated embodiment, the Boolean sub-function implemented by the second circuit 540 may be represented as:

$$H_{2m}^* = [(a_{m-1} \vee b_{m-1}) \wedge a_{m-2} \wedge b_{m-2}] \vee \ldots$$
$$\vee [(a_{m-1} \vee b_{m-1}) \wedge \ldots \wedge (a_1 \vee b_1) \wedge a_0 \wedge b_0]$$
$$= (a_{m-1} \vee b_{m-1}) \wedge \{(a_{m-2} \wedge b_{m-2}) \vee \ldots$$
$$\vee (a_2 \vee b_2) \wedge [(a_1 \wedge b_1) \vee (a_1 \vee b_1) \wedge a_0 \wedge b_0] \ldots \}.$$

wherein "$\vee$" represents the logical OR function and "$\wedge$" represents the logical AND function.

The combination of the linearly separable form of the function $H_{2m}$ and the Boolean sub-function $H_{2m}^*$ makes the transfer function of the logic gate 500 non-linear and better separates certain pertinent voltage levels, while compressing certain extraneous voltage levels. Separating the pertinent voltage levels may thus increase the noise tolerance of the logic gate 500. The noise-suppression logic circuit 540 may be directly implemented using n-channel MOS transistors, wherein parallel-coupled branches implement OR functions while series-coupled branches implement AND functions. Of course, other implementations of the noise-suppression logic circuit (e.g., other implementations of the $H_{2m}^*$ sub-function) are well within the broad scope of the present invention. For example, the noise-suppression logic circuit 540 may be implemented using only p-channel MOS transistors, only n-channel MOS transistors or a combination of p-channel and n-channel MOS transistors. Of course, an anti-floating logic circuit (such as the anti-floating logic circuit 350 of FIG. 3A) may be employed as desired.

Although the present invention has been described in detail, those skilled in the art should understand that they can make various changes, substitutions and alterations herein without departing from the spirit and scope of the invention in its broadest form.

What is claimed is:

1. A logic gate, comprising:
   a summer, having at least two single-bit inputs and a noise-suppression input with corresponding conductances representing discrete weights, that generates a weighted sum of input binary digits presented at said at least two single-bit inputs and said noise-suppression input; and
   a quantizer, coupled to said summer, that generates an output binary digit at a binary output thereof that is a function of said weighted sum, said noise-suppression input increasing a noise tolerance of said logic gate.

2. The gate as recited in claim 1 wherein said summer comprises a noise-suppression logic circuit that develops said noise-suppression input.

3. The gate as recited in claim 2 wherein some of said input binary digits presented at said at least two single-bit inputs are also presented at said noise-suppression logic circuit.

4. The gate as recited in claim 2 wherein all of said input binary digits presented at said at least two single-bit inputs are also presented at said noise-suppression logic circuit.

5. The gate as recited in claim 1 wherein said discrete weights are integer multiples of a predetermined number.

6. The gate as recited in claim 1 wherein each of said at least two single-bit inputs and said noise-suppression input comprises:
   a voltage source; and
   a transistor, coupled to said voltage source and having a selectable intrinsic conductance, that couples said voltage source to said summer as a function of a corresponding particular input binary digit.

7. The gate as recited in claim 6 wherein said transistor has a size that determines said selectable intrinsic conductance.

8. The gate as recited in claim 6 wherein said transistor is selected from the group consisting of:
   a p-channel metal oxide semiconductor (MOS) transistor, and
   an n-channel MOS transistor.

9. The gate as recited in claim 6 wherein a greater one of said discrete weights is associated with a one of said at least two single-bit inputs having a p-channel MOS transistor.

10. The gate as recited in claim 1 further comprising a threshold input that provides a threshold number to said quantizer, said output binary digit being a function of a relationship between said weighted sum and said threshold number.

11. The gate as recited in claim 10 wherein said threshold number is determined by relative sizes of at least two transistors forming said quantizer.

12. The gate as recited in claim 1 wherein said quantizer comprises an inverter.

13. A method of performing a logic operation with respect to input binary digits, comprising:
   employing conductances representing discrete weights and corresponding to at least two single-bit inputs and a noise-suppression input to generate a weighted sum of said input binary digits presented at said at least two single-bit inputs and said noise-suppression input; and generating an output binary digit that is a function of said weighted sum, said noise-suppression input increasing a noise tolerance of said generating.

14. The method as recited in claim 13 further comprising developing said noise-suppression input with a noise-suppression logic circuit.

15. The method as recited in claim 13 wherein said noise-suppression input comprises a combination of some of said input binary digits.

16. The method as recited in claim 13 wherein said noise-suppression input comprises a combination of all of said input binary digits.

17. The method as recited in claim 13 wherein said discrete weights are integer multiples of a predetermined number.

18. The method as recited in claim 13 wherein said employing comprises:
  deriving a voltage from a voltage source; and
  passing said voltage through a transistor having a selectable intrinsic conductance as a function of a corresponding particular input binary digit.

19. The method as recited in claim 18 wherein said transistor has a size that determines said selectable intrinsic conductance.

20. The method as recited in claim 18 wherein said transistor is selected from the group consisting of:
  a p-channel metal oxide semiconductor (MOS) transistor, and
  an n-channel MOS transistor.

21. The method as recited in claim 18 wherein a greater one of said discrete weights is associated with a one of said at least two single-bit inputs having a p-channel MOS transistor.

22. The method as recited in claim 13 wherein said generating further comprises generating said output binary digit as a function of a relationship between said weighted sum and a threshold number.

23. The method as recited in claim 13 wherein said generating comprises inverting said weighted sum.

24. A method of manufacturing a logic gate, comprising:
  providing a summer having at least two single-bit inputs and a noise-suppression input with corresponding conductances representing discrete weights, said summer capable of generating a weighted sum of input binary digits presented at said at least two single-bit inputs and said noise-suppression input; and
  coupling a quantizer to said summer, said quantizer capable of generating an output binary digit at a binary output thereof that is a function of said weighted sum, said noise-suppression input increasing a noise tolerance of said logic gate.

25. The method as recited in claim 24 wherein said summer comprises a noise-suppression logic circuit that develops said noise-suppression input.

26. The method as recited in claim 24 wherein some of said input binary digits presented at said at least two single-bit inputs are also presented at said noise-suppression logic circuit.

27. The method as recited in claim 24 wherein all of said input binary digits presented at said at least two single-bit inputs are also presented at said noise-suppression logic circuit.

28. The method as recited in claim 24 wherein said discrete weights are integer multiples of a predetermined number.

29. The method as recited in claim 24 wherein each of said at least two single-bit inputs and said noise-suppression input comprises:
  a voltage source; and
  a transistor, coupled to said voltage source and having a selectable intrinsic conductance, that couples said voltage source to said summer as a function of a corresponding particular input binary digit.

30. The method as recited in claim 29 wherein said transistor has a size that determines said selectable intrinsic conductance.

31. The method as recited in claim 29 wherein said transistor is selected from the group consisting of:
  a p-channel metal oxide semiconductor (MOS) transistor, and
  an n-channel MOS transistor.

32. The method as recited in claim 29 wherein a greater one of said discrete weights is associated with a one of said at least two single-bit inputs having a p-channel MOS transistor.

33. The method as recited in claim 24 further comprising a threshold input that provides a threshold number to said quantizer, said output binary digit being a function of a relationship between said weighted sum and said threshold number.

34. The method as recited in claim 33 further comprising encoding said threshold number in the relative sizes of at least two transistors forming said quantizer.

35. The method as recited in claim 24 wherein said quantizer comprises an inverter.

36. A logic gate, comprising:
  a summer, having at least two single-bit inputs and an anti-floating input with corresponding conductances representing discrete weights, that generates a weighted sum of input binary digits presented at said at least two single-bit inputs and said anti-floating input; and
  a quantizer, coupled to said summer, that generates an output binary digit at a binary output thereof that is a function of said weighted sum, said anti-floating input preventing said weighted sum from being in an indefinite state.

37. The gate as recited in claim 36 wherein said summer comprises an anti-floating logic circuit that develops said anti-floating input.

38. The gate as recited in claim 37 wherein said anti-floating logic circuit implements an AND logic function.

39. The gate as recited in claim 37 wherein some of said input binary digits presented at said at least two single-bit inputs are also presented at said anti-floating logic circuit.

40. The gate as recited in claim 37 wherein all of said input binary digits presented at said at least two single-bit inputs are also presented at said anti-floating logic circuit.

41. The gate as recited in claim 36 wherein said discrete weights are integer multiples of a predetermined number.

42. The gate as recited in claim 36 wherein each of said at least two single-bit inputs and said anti-floating input comprises:
  a voltage source; and
  a transistor, coupled to said voltage source and having a selectable intrinsic conductance, that couples said voltage source to said summer as a function of a corresponding particular input binary digit.

43. The gate as recited in claim 42 wherein said transistor has a size that determines said selectable intrinsic conductance.

44. The gate as recited in claim 42 wherein said transistor is selected from the group consisting of:

a p-channel metal oxide semiconductor (MOS) transistor, and an n-channel MOS transistor.

45. The gate as recited in claim 42 wherein a greater one of said discrete weights is associated with a one of said at least two single-bit inputs having a p-channel MOS transistor.

46. The gate as recited in claim 36 further comprising a threshold input that provides a threshold number to said quantizer, said output binary digit being a function of a relationship between said weighted sum and said threshold number.

47. The gate as recited in claim 46 wherein said threshold number is determined by relative sizes of at least two transistors forming said quantizer.

48. The gate as recited in claim 36 wherein said quantizer comprises an inverter.

49. A method of performing a logic operation with respect to input binary digits, comprising:

employing conductances representing discrete weights and corresponding to at least two single-bit inputs and an anti-floating input to generate a weighted sum of said input binary digits presented at said at least two single-bit inputs and said anti-floating input; and generating an output binary digit that is a function of said weighted sum, said anti-floating input preventing said weighted sum from being in an indefinite state.

50. The method as recited in claim 49 further comprising developing said anti-floating input with an anti-floating logic circuit.

51. The method as recited in claim 49 wherein said anti-floating logic circuit implements an AND logic function.

52. The method as recited in claim 49 wherein said anti-floating input comprises a combination of some of said input binary digits.

53. The method as recited in claim 49 wherein said anti-floating input comprises a combination of all of said input binary digits.

54. The method as recited in claim 49 wherein said discrete weights are integer multiples of a predetermined number.

55. The method as recited in claim 49 wherein said employing comprises:

deriving a voltage from a voltage source; and passing said voltage through a transistor having a selectable intrinsic conductance as a function of a corresponding particular input binary digit.

56. The method as recited in claim 55 wherein said transistor has a size that determines said selectable intrinsic conductance.

57. The method as recited in claim 55 wherein said transistor is selected from the group consisting of:

a p-channel metal oxide semiconductor (MOS) transistor, and an n-channel MOS transistor.

58. The method as recited in claim 55 wherein a greater one of said discrete weights is associated with a one of said at least two single-bit inputs having a p-channel MOS transistor.

59. The method as recited in claim 49 wherein said generating further comprises generating said output binary digit as a function of a relationship between said weighted sum and a threshold number.

60. The method as recited in claim 49 wherein said generating comprises inverting said weighted sum.

61. A method of manufacturing a logic gate, comprising:

providing a summer having at least two single-bit inputs and an anti-floating input with corresponding conductances representing discrete weights, said summer capable of generating a weighted sum of input binary digits presented at said at least two single-bit inputs and said anti-floating input; and coupling a quantizer to said summer, said quantizer capable of generating an output binary digit at a binary output thereof that is a function of said weighted sum, said anti-floating input preventing said weighted sum from being in an indefinite state.

62. The method as recited in claim 61 wherein said summer comprises an anti-floating logic circuit that develops said anti-floating input.

63. The method as recited in claim 61 wherein said anti-floating logic circuit implements an AND logic function.

64. The method as recited in claim 61 wherein some of said input binary digits presented at said at least two single-bit inputs are also presented at said anti-floating logic circuit.

65. The method as recited in claim 61 wherein all of said input binary digits presented at said at least two single-bit inputs are also presented at said anti-floating logic circuit.

66. The method as recited in claim 61 wherein said discrete weights are integer multiples of a predetermined number.

67. The method as recited in claim 61 wherein each of said at least two single-bit inputs and said anti-floating input comprises:

a voltage source; and a transistor, coupled to said voltage source and having a selectable intrinsic conductance, that couples said voltage source to said summer as a function of a corresponding particular input binary digit.

68. The method as recited in claim 67 wherein said transistor has a size that determines said selectable intrinsic conductance.

69. The method as recited in claim 67 wherein said transistor is selected from the group consisting of:

a p-channel metal oxide semiconductor (MOS) transistor, and an n-channel MOS transistor.

70. The method as recited in claim 67 wherein a greater one of said discrete weights is associated with a one of said at least two single-bit inputs having a p-channel MOS transistor.

71. The method as recited in claim 61 wherein said quantizer comprises a threshold input that provides a threshold number to said quantizer, said output binary digit being a function of a relationship between said weighted sum and said threshold number.

72. The method as recited in claim 71 further comprising encoding said threshold number in the relative sizes of at least two transistors forming said quantizer.

73. The method as recited in claim 61 wherein said quantizer comprises an inverter.

74. An adder, comprising:

a plurality of logic gates for deriving a carry-out bit, each of said plurality of logic gates including:

a summer, having at least two single-bit inputs a noise-suppression input and an anti-floating input with corresponding conductances representing discrete weights, that generates a weighted sum of input binary digits presented at said at least two single-bit inputs, said noise-suppression input and said anti-floating input, and a quantizer, coupled to said summer, that generates an output binary digit at a binary output thereof that is a function of said weighted sum, said noise-suppression input increasing a noise tolerance of said logic gate, said anti-floating input preventing said weighted sum from being in an indefinite state.

75. The adder as recited in claim 74 wherein at least some of said plurality of logic gates comprise first, second, third and fourth single-bit inputs having discrete weights of 1, 1, 2 and 2, respectively.

76. The adder as recited in claim 74 further comprising a circuit for deriving at least one group-carry-generate bit.

77. A method of adding, comprising:

deriving a carry-out bit with a plurality of logic gates, each of said plurality of logic gates including:

a summer, having at least two single-bit inputs, a noise-suppression input and an anti-floating input with corresponding conductances representing discrete weights, that generates a weighted sum of input binary digits presented at said at least two single-bit inputs, said noise-suppression input and said anti-floating input, and a quantizer, coupled to said summer, that generates an output binary digit at a binary output thereof that is a function of said weighted sum, said noise-suppression input increasing a noise tolerance of said logic gate, said anti-floating input preventing said weighted sum from being in an indefinite state.

78. The method as recited in claim 77 wherein at least some of said plurality of logic gates comprise first, second, third and fourth binary inputs having discrete weights of 1, 1, 2 and 2, respectively.

79. A method of manufacturing an adder, comprising:

assembling a plurality of logic gates to derive a carry-out bit, each of said plurality of logic gates including:

a summer, having at least two single-bit inputs, a noise-suppression input and an anti-floating input with corresponding conductances representing discrete weights, that generates a weighted sum of input binary digits presented at said at least two single-bit inputs, said noise-suppression input and said anti-floating input, and a quantizer, coupled to said summer, that generates an output binary digit at a binary output thereof that is a function of said weighted sum, said noise-suppression input increasing a noise tolerance of said logic gate, said anti-floating input preventing said weighted sum from being in an indefinite state.

80. The method as recited in claim 79 wherein at least some of said plurality of logic gates comprise first, second, third and fourth binary inputs having discrete weights of 1, 1, 2 and 2, respectively.

* * * * *

UNITED STATES PATENT AND TRADEMARK OFFICE
CERTIFICATE OF CORRECTION

PATENT NO. : 6,430,585 B1
DATED : August 6, 2002
INVENTOR(S) : Valeriu Beiu

It is certified that error appears in the above-identified patent and that said Letters Patent is hereby corrected as shown below:

Column 5,
Line 42, "8" should be -- $\Theta$ --.
Line 45, "$x_i, ..., x_{i+1}$," should be -- $x_i, x_{i+1}$, --

Column 7,
Line 57, "$a_2 \ b_s$" should be -- $a_s \ b_s$ --

Column 9,
Line 63, "that a" should be -- that $\propto$ --

Column 11,
Line 4, "(i.e., $a_t \ b_t=10$)" should be -- (i.e., $a_t \ b_t=01$ or $a_t b_t=10$) --
Lines 27 and 28,
"$H_{2m} = (a_{m-1} \wedge b_{m-1}) \vee [(a_{m-1} \vee b_{m-1}) \wedge a_{m-2} \vee b_{m-2}] \wedge ... \wedge [(a_{m-1} \vee b_{m-1}) \wedge ... \wedge (a_1+b_1) \wedge a_0 \wedge b_0]$" should be
-- $H_{2m} = (a_{m-1} \wedge b_{m-1}) \vee [(a_{m-1} \vee b_{m-1}) \wedge a_{m-2} \wedge b_{m-2}] \vee ... \vee [(a_{m-1} \vee b_{m-1}) \wedge ... \wedge (a_1+b_1) \wedge a_0 \wedge b_0]$ --
Lines 35 and 36, "$H_{2m} = sgn[2^{m-1}a_{m-1}+2^{m-1}b_{m-1}+2_{m-2}a_{m-2}+2^{m-2}b_{m-2}+...+2^0 a_0+2^0 b_0-(2^m-0.5)]$" should be -- $H_{2m} = sgn[2^{m-1}a_{m-1}+2^{m-1}b_{m-1}+2^{m-2}a_{m-2}+2^{m-2}b_{m-2}+...+2^0 a_0+2^0 b_0-(2^m-0.5)]$ --
Line 43, "$H^*_{2m}$" should be -- $H_{2m}^*$ --

Signed and Sealed this

Third Day of June, 2003

JAMES E. ROGAN
*Director of the United States Patent and Trademark Office*